(12) United States Patent
Tai et al.

(10) Patent No.: US 7,099,729 B2
(45) Date of Patent: Aug. 29, 2006

(54) SEMICONDUCTOR PROCESS AND YIELD ANALYSIS INTEGRATED REAL-TIME MANAGEMENT METHOD

(75) Inventors: Hung-En Tai, Taipei Hsien (TW);
Chien-Chung Chen, Hsin-Chu (TW);
Sheng-Jen Wang, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 277 days.

(21) Appl. No.: 10/708,277

(22) Filed: Feb. 20, 2004

(65) Prior Publication Data
US 2005/0187648 A1 Aug. 25, 2005

(51) Int. Cl.
*G06F 19/00* (2006.01)
(52) U.S. Cl. .................. 700/110; 700/121; 700/109; 702/35; 702/84; 257/E21.525
(58) Field of Classification Search .............. 700/110, 700/121, 109; 702/35, 81, 84; 257/E21.525; 716/4
See application file for complete search history.

(56) References Cited
U.S. PATENT DOCUMENTS

| | | | | |
|---|---|---|---|---|
| 5,726,920 A | | 3/1998 | Chen et al. | |
| 5,761,064 A | * | 6/1998 | La et al. | 700/110 |
| 6,314,379 B1 | * | 11/2001 | Hu et al. | 702/81 |
| 6,446,022 B1 | | 9/2002 | Coss, Jr. et al. | |
| 6,611,728 B1 | | 8/2003 | Morioka et al. | |
| 6,720,194 B1 | * | 4/2004 | Miller et al. | 438/14 |
| 6,828,776 B1 | * | 12/2004 | Tai et al. | 324/158.1 |
| 2001/0000460 A1 | | 4/2001 | Ishihara et al. | |

* cited by examiner

*Primary Examiner*—Leo Picard
*Assistant Examiner*—Steven R. Garland
(74) *Attorney, Agent, or Firm*—Winston Hsu

(57) ABSTRACT

A semiconductor process and yield analysis integrated real-time management method comprises inspecting a plurality of semiconductor products with a plurality of items to generate and record a plurality of inspecting results during semiconductor process, classifying the semiconductor products as a plurality of groups with a default rule to generate and record an initial data in a database, indexing a plurality of semiconductor product groups and the corresponding initial data from the database by a default product rule and parameter to calculate a corresponding analysis result, and displaying the analysis result according to the indexed semiconductor product groups and the initial data.

19 Claims, 10 Drawing Sheets

|  | Date | Date | Date | Date | Date |
|---|---|---|---|---|---|
| Diffusion | | | | | |
| Etch | | | | | |
| Photo | | | | | |
| Thin film | | | | | |

| Alarm list | | | | |
|---|---|---|---|---|
| Lot | EQP | Date | Cause | Comment |
| Lot number | | | | |
| Lot number | | | | |
| Lot number | | | | |
| Lot number | | | | |

Fig. 8

SEMICONDUCTOR PROCESS AND YIELD ANALYSIS INTEGRATED REAL-TIME MANAGEMENT METHOD

BACKGROUND OF INVENTION

1. Field of the Invention

The present invention relates to a management method, and more particularly, to an integrated real-time management method which provides semiconductor process and yield analysis for a plurality of management classes.

2. Description of the Prior Art

A lot of data are used in the semiconductor process to monitor, control and improve all kinds of manufacturing processes. Please refer to FIG. 1; FIG. 1 is a block diagram of a semiconductor process 10 according to the prior art. The semiconductor process 10 processes a plurality of wafers 12 through seven steps, including a step of thin film 14, a step of diffusion 16, a step of photo 18, a step of etch 20, a sample test 22, a wafer test 24, and a final test 26. A plurality of inspecting results are generated in each step to control and improve the semiconductor process 10. However, the inspecting results are merely raw data. In the prior art, there are no effective ways to integrate these raw data generated in each steps, therefore it is difficult to monitor the performance of the semiconductor process 10. For different management classes, it is also hard to select the effective data from the large amount of the raw data.

SUMMARY OF INVENTION

It is therefore a primary objective of the claimed invention to provide a semiconductor process and yield analysis integrated real-time management method, to solve the above-mentioned problem.

According to the claimed invention, a semiconductor process and yield analysis integrated real-time management method comprises inspecting a plurality of semiconductor products with a plurality of items to generate and record a plurality of inspecting results during semiconductor process, classifying the semiconductor products as a plurality of groups with a default rule to generate and record an initial data in a database, indexing a plurality of semiconductor product groups and the corresponding initial data from the database by a default product rule and parameter to calculate a corresponding analysis result, and displaying the analysis result according to the indexed semiconductor product groups and the initial data.

It is an advantage of the claimed invention that the semiconductor process and yield analysis integrated real-time management method can transfer the inspecting results of semiconductor process to all kinds of tables and charts for providing management and analysis. The tables and charts are integrated to present on the web page according to the management classes, which provides real-time interactive monitor and management.

These and other objectives of the claimed invention will no doubt become obvious to those of ordinary skill in the art after reading the following detailed description of the preferred embodiment that is illustrated in the various figures and drawings.

BRIEF DESCRIPTION OF DRAWINGS

FIG. 8 is a diagram of a displaying frame of the alarming RT-SPC class shown in FIG. 3.

DETAILED DESCRIPTION

Figure 2:
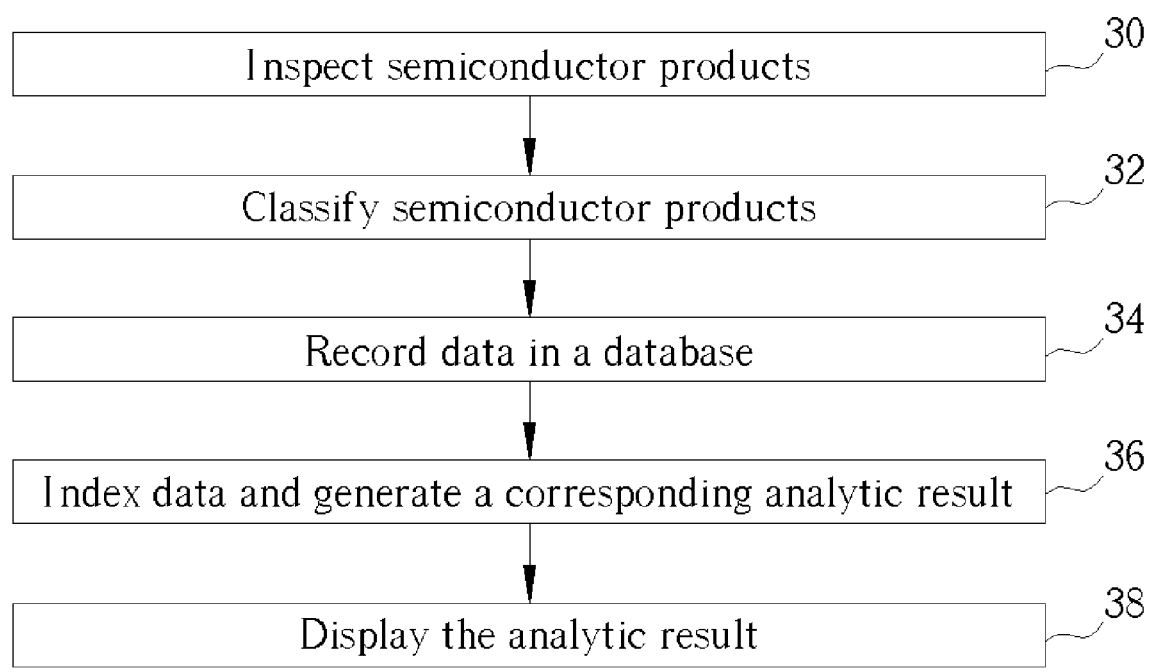
FIG. 2 is a diagram of semiconductor process and yield analysis management method according to the present invention.

Please refer to FIG. 2. FIG. 2 is a diagram of semiconductor process and yield analysis management method according to the present invention. The method includes the following steps:

step 30: inspecting a plurality of semiconductor products with a plurality of items during semiconductor process, and recording a plurality of inspecting results of each semiconductor product;

step 32: classifying the semiconductor products as a plurality of groups with a default rule, generating raw data according to the inspecting results of each group;

step 34: recording the raw data and the corresponding groups in a database;

step 36: indexing a plurality of semiconductor product groups from the database by a default product rule, indexing the corresponding raw data of each semiconductor product group by default parameters, and calculating a corresponding analysis result from the indexed semiconductor product groups and raw data with analysis modules; and step 38: displaying the analysis result on a web page according to the indexed semiconductor product groups and the analysis results.

Figure 1:
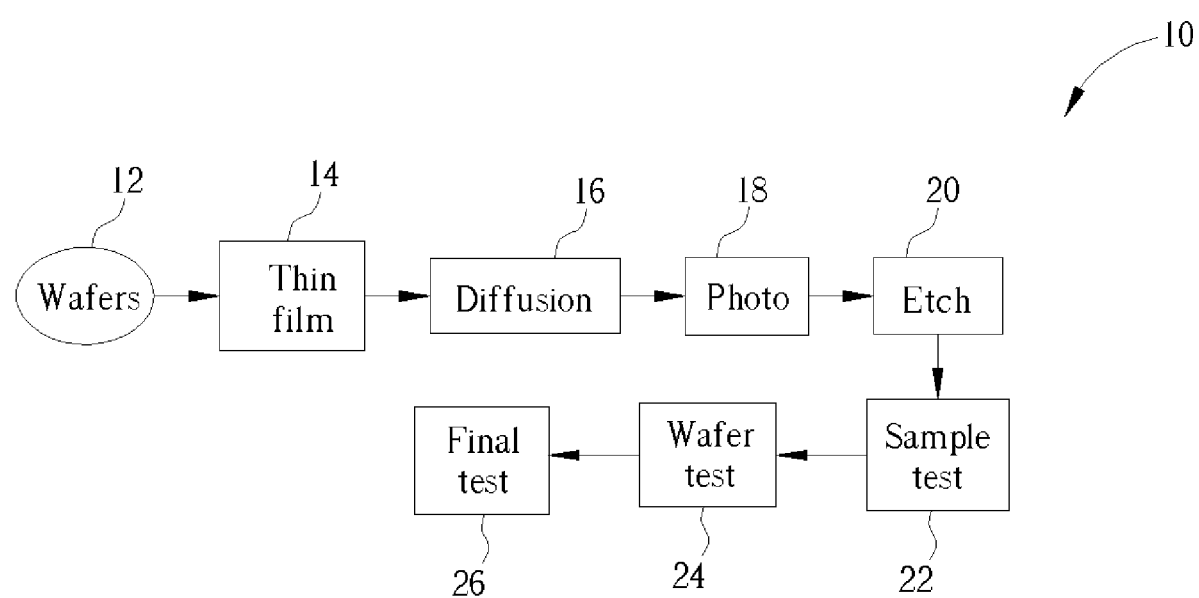
FIG. 1 is a block diagram of semiconductor process according to the prior art.
Figure 3:
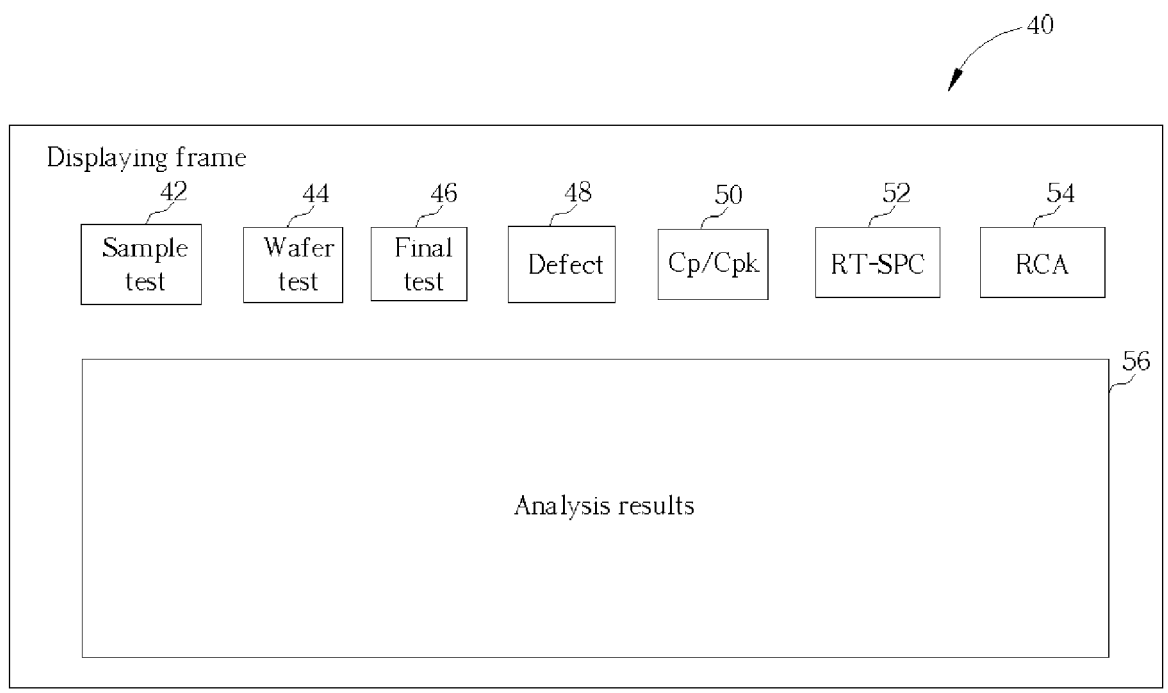
FIG. 3 is a diagram of a displaying frame in the displaying step of FIG. 2.

Please refer to FIG. 3. FIG. 3 is a diagram of a displaying frame 40 in the displaying step of FIG. 2. The displaying frame 40 presents the analysis results 56 inspected in the semiconductor process shown in FIG. 1 according to seven classes, including a sample test class 42, a wafer test class 44, a final test class 46, a class of the Cp/Cpk statistics 50, an alarming real-time spec (RT-SPC) class 52, and a root case analysis (RCA) class 54. The analysis results of each class are described in the following.

Figure 4:
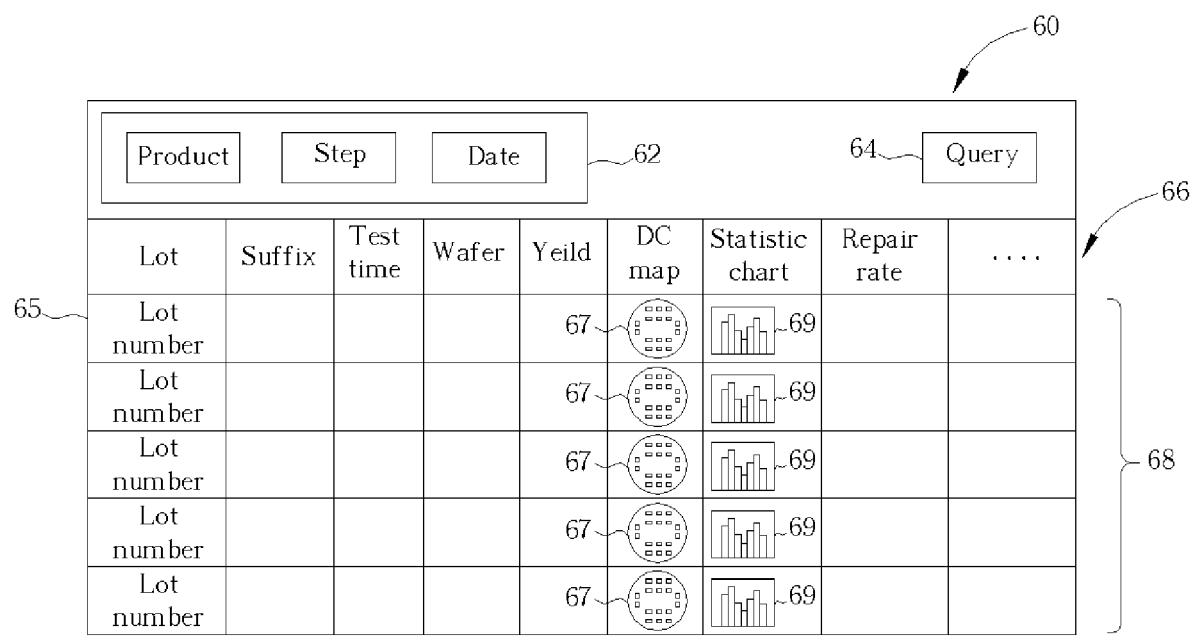
FIG. 4 is a diagram of a displaying frame of the sample test class, the wafer test class, or the final test class shown in FIG. 3.
Figure 5:
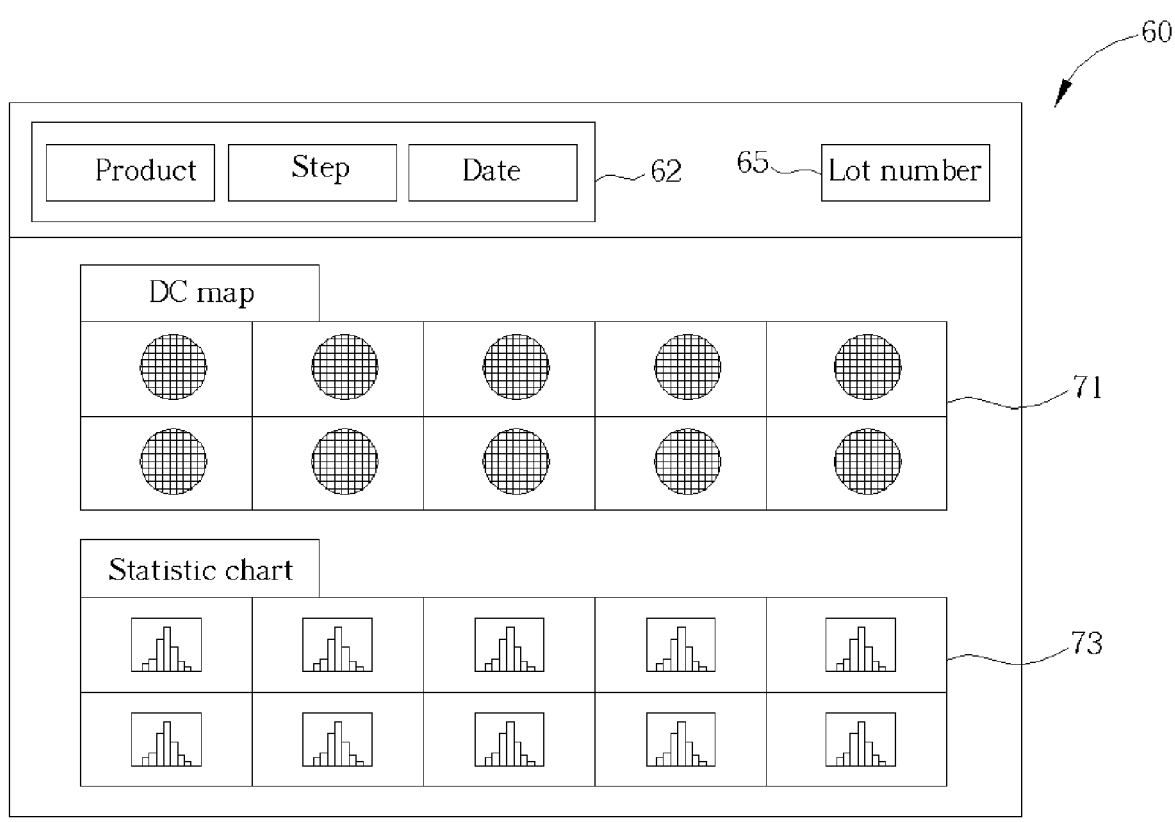
FIG. 5 is a diagram of a displaying frame of the DC maps and statistic charts shown in FIG. 4.

Please refer to FIG. 4. FIG. 4 is a diagram of a displaying frame 60 of the sample test class 42, the wafer test class 44, or the final test class 46 shown in FIG. 3. The displaying frame 60 includes a plurality of query items 62, a query button 64, a plurality of analytic items 66, and a plurality of analysis results 68. Users set the query items 62, including semiconductor products, manufacturing steps, and manufacturing date. As the query button 64 is pushed, the analysis results 68 are listed according to a plurality of lot numbers 65 and the analytic items 66, including the process lots, suffix of product names, test time, wafer numbers, yield, DC map of each wafer, statistic charts, repair rates, and so on. That is, the semiconductor products are grouped by wafer, lot, time (like test time or manufacturing date), and all related statistical analysis result (like yield, repair rate) can be accessed by users through an integrated interface as shown in FIG. 4. Wherein a plurality of DC map buttons 67 and a plurality of statistic chart items 69 are hyper-linked to another display frame, which the shows DC map and statistic chart of each wafer in the assigned lot. Please refer to FIG. 5. FIG. 5 is a diagram of a displaying frame of the DC maps and statistic charts shown in FIG. 4. According to query items 62 and the lot number 65, the DC map 71 and statistic chart 73 of each wafer are shown in the displaying frame 60 as an overview of the semiconductor processing in the assigned lot.

Figure 6:
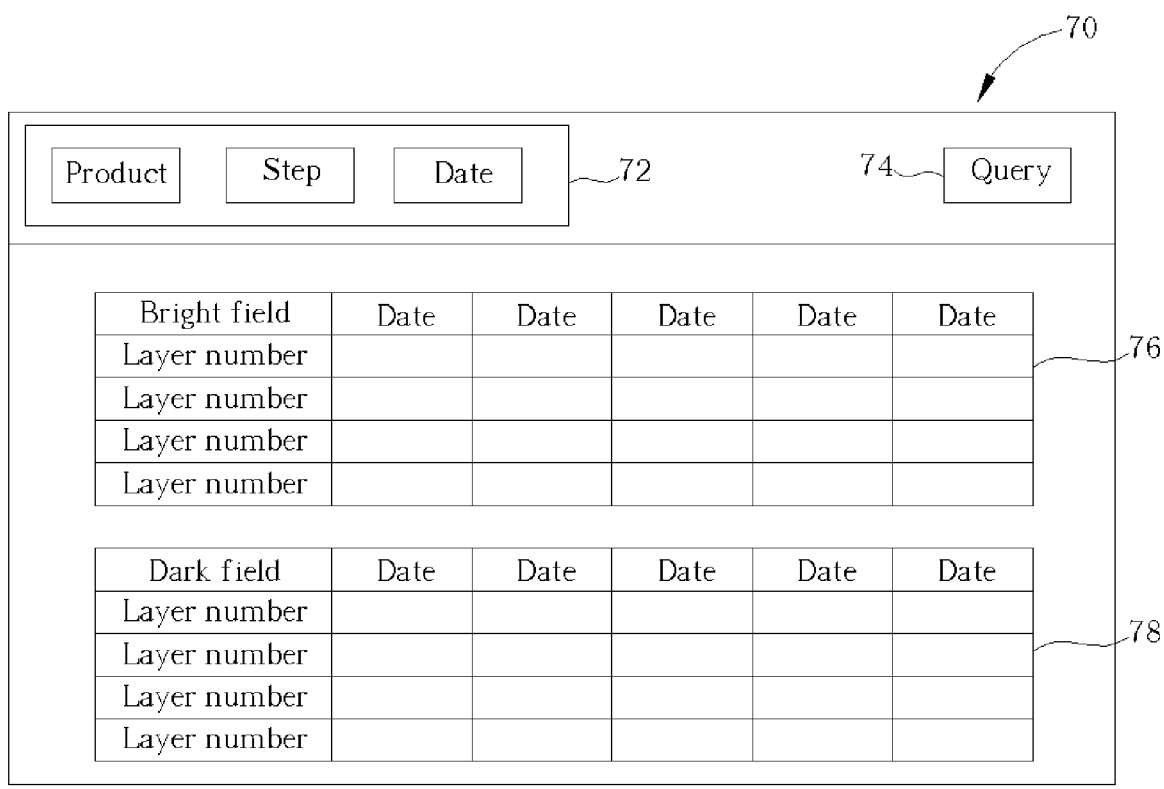
FIG. 6 is a diagram of a displaying frame of the defect inspection class shown in FIG. 3.

Please refer to FIG. 6. FIG. 6 is a diagram of a displaying frame 70 of the defect inspection class 48 shown in FIG. 3. The displaying frame 70 includes a plurality of query items 72, a query button 74, an analysis result of bright field 76, and an analysis result of dark field 78. Users set the query items 72, including semiconductor products and manufacturing date. As the query button 74 is pushed on, the analysis result of bright field 76 and the analysis result of dark field 78 are listed according to the layer numbers of the wafers, which is similar to the analysis results 68 shown in FIG. 4, including the process lots, suffix of product names, test time, wafer numbers, yield, DC map of each wafer, statistic charts, repair rates, and so on. That is, semiconductor products could be grouped according to processes types (like dark field and bright field), and the corresponding analysis results can be accessed through an interface like shown in FIG. 6.

Figure 7:
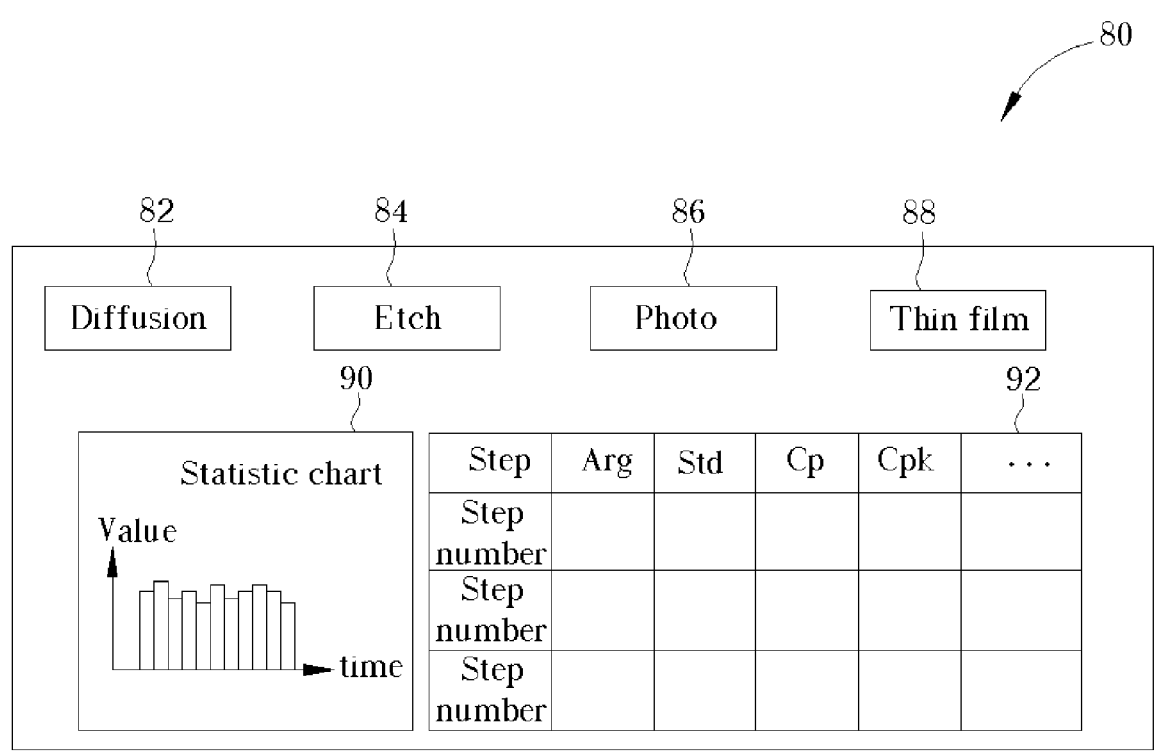
FIG. 7 is a diagram of a displaying frame of the Cp/Cpk statistics class shown in FIG. 3.

Please refer to FIG. 7. FIG. 7 is a diagram of the displaying frame 80 of the Cp/Cpk statistics class shown in FIG. 3. The displaying frame 80 presents statistic data of four segments of semiconductor process, including a segment of diffusion 82, a segment of etch 84, a segment of photo 86, and a segment of thin film 88. The statistic data of each segment are shown in a statistic chart 90 and a statistic table 92. The statistic chart 90 shows the trend of statistic values versus time. The statistic table 92 shows the statistic values, including the average, the standard deviation, Cp, and Cpk of each manufacturing step.

Figure 9:
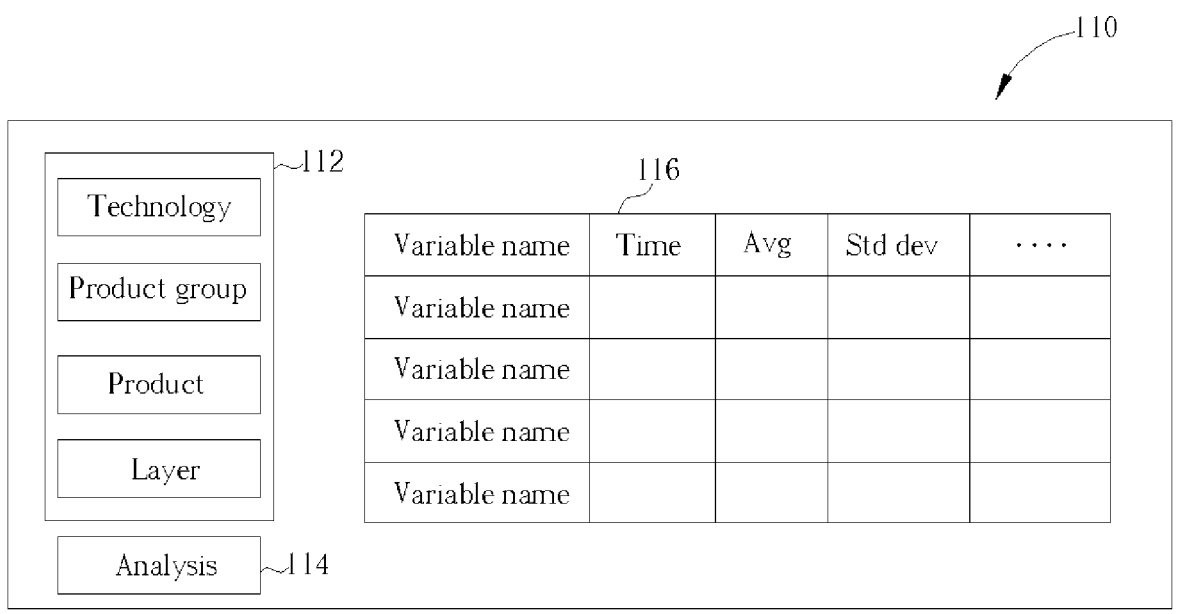
FIG. 9 is a diagram of a displaying frame of the RCA class shown in FIG. 3.

Please refer to FIG. 8. FIG. 8 is a diagram of a displaying frame 100 of the alarming RT-SPC class shown in FIG. 3. The displaying frame 100 includes an alarming table 102, which shows the alarming condition of each segment of semiconductor process by manufacturing date. The details of each segment are shown in an alarm list 104, which shows the manufacturing lots, the manufacturing equipments, the manufacturing date, and the cause of out-spec according to the lot numbers of the wafers. In addition, users can interactively comment in the alarm list 104. FIG. 9 is a diagram of a displaying frame 110 of the RCA class shown in FIG. 3. The displaying frame 110 includes a plurality of analysis items 112, an analysis button 114, and a plurality of analysis results 116. Users set the analysis items 112, including manufacturing technology, manufacturing product groups, manufacturing products and manufacturing layers. As the analysis button 114 is pushed on, the analysis results 116 are listed by manufacturing variable names, including manufacturing time, the average, the standard deviation, and so on.

Figure 10:
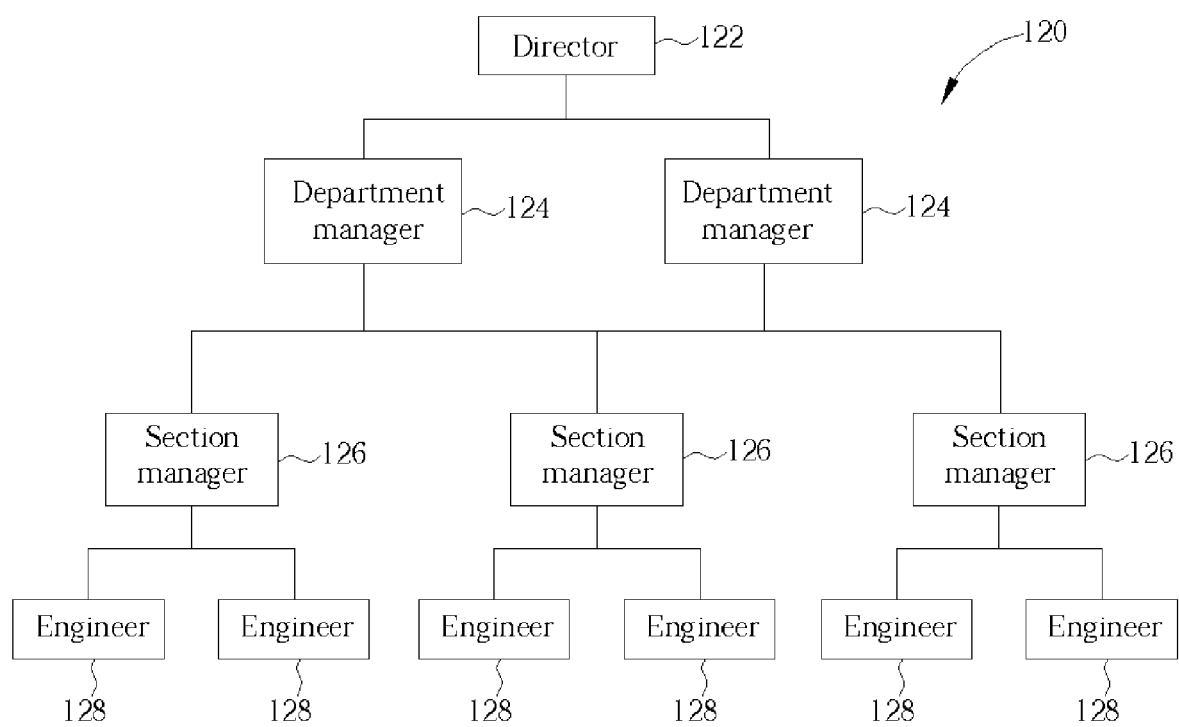
FIG. 10 is a diagram of a multiple-class management architecture.

Please refer to FIG. 10. FIG. 10 is a diagram of a multiple-class management architecture 120. The multiple-class management architecture 120 includes a director 122, a plurality of department managers 124, a plurality of section managers 126, and a plurality of engineers 128. The statistic data are present for each class of managers through a lot of analytic modules, including T-test, a one-way analysis of variance (ANOVA), a two-way analysis of variance, or box plots. The analytic results are also present according to the different management classes. For example, the director 122 monitors the yield value for yield improvement, the department managers 124 monitor the inspecting results of defect inspection to deal with the problems of the processing layers, the section managers 126 monitor the statistic results of each processing section, and the engineering 128 monitor the inspecting results of each test to in-line control processing quality. That is, the presentation of the statistical analysis results can be fully customized by users of different management classes. In practical, the invention can provide a plurality of default displaying modes, each mode recording a pre-determined way of displaying analysis results. Then a user can set a costumed displaying mode by selecting among the default displaying modes. For example, an engineer user may prefer to obtain in-line QC information through the invention, then the engineer user can select related default displaying modes to show in-line QC analysis result. On the other hand, a department manager may prefer to monitor long-term yield performance of a given kind of product or a given process, so the manager can select related default displaying modes to show corresponding analysis results.

In contrast to the prior art, the present invention semiconductor process and yield analysis integrated real-time management method can transfer the inspecting results of semiconductor process to all kinds of tables and charts for providing management and analysis. The tables and charts are integrated to present on the web page according to the management classes, which provides real-time interactive monitor and management.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A semiconductor process and yield analysis integrated real-time management method, comprising:
   inspecting a plurality of semiconductor products with a plurality of items during semiconductor process, and recording a plurality of inspecting results of each semiconductor product;
   classifying the semiconductor products as a plurality of groups with a predetermined rule, generating a raw data according to the inspecting results of each group, and recording the raw data and the corresponding groups in a database;
   indexing a plurality of semiconductor product groups from the database by a predetermined product rule, indexing the corresponding raw data of each semiconductor product group by a predetermined parameter, and calculating a corresponding analysis result from the indexed semiconductor product groups and raw data with an analysis module, wherein each of the semiconductor products are chips situated on different positions of a wafer, indexing the semiconductor product groups is performed by gathering statics of the inspecting results according to their positions; and
   displaying the analysis result according to the indexed semiconductor product groups and the raw data and displaying the inspecting results of each chip according to its position on the wafer.

2. The method of claim 1 wherein the semiconductor products are from different kinds or lots of wafers, indexing the semiconductor product groups is performed by gathering statistics of the inspecting results according to the kinds, lots or manufacturing dates of wafers, and displaying the inspecting results is performed according to the kind, lot, and manufacturing date of each wafer.

3. The method of claim 1 wherein inspecting results and statistics of the semiconductor products are indexed and displayed according to a predetermined period in which the semiconductor products are produced.

4. The method of claim 1 wherein each semiconductor product is a wafer processed by different processes, the inspecting results are the results of defect inspection of the wafer in the manufacturing process, indexing the results of defect inspection, and displaying the results of defect inspection is performed according to a kind and date of the processes.

5. The method of claim 1 wherein each semiconductor product is a wafer processed by different processes, indexing and gathering statistics are performed by examining time trends of the inspecting results of the processes, and trend charts are displayed according to kinds and dates of the processes.

6. The method of claim 1 wherein each semiconductor product is a wafer processed by different manufacturing processes, indexing and gathering statistics are performed by indexing and gathering inspecting results within a predetermined period, and the corresponding inspecting results are displayed according to the predetermined period.

7. The method of claim 1 further comprising recording the analysis results of different periods, comparing the similarity of the analysis results, and displaying the similar analysis results.

8. The method of claim 7 wherein the analysis results in the different periods are recorded as a plurality of corresponding modules of analysis results according to an experimental value, and after comparing an analysis result with another previous analysis result, the method further comprises updating the experimental value to build a new module of analysis results if the analysis result is not similar to the previous analysis results, or recording the analysis result as a module of analysis results if the analysis result is similar to the previous analysis result.

9. The method of claim 1 wherein the analysis result is displayed with a visual interface of a computer.

10. The method of claim 9 wherein each indexed semiconductor product group is listed with the visual interface, and users can find the corresponding raw data and corresponding analysis results according to the indexed semiconductor product groups in the cross reference way.

11. The method of claim 1 wherein the raw data are listed with a visual interface, and users can find the corresponding semiconductor product groups and the corresponding analysis results according to the indexed raw data in a cross reference way.

12. The method of claim 1 further comprising an in-line yield inspection of semiconductor processes.

13. The method of claim 1 further comprising a sample test of semiconductor wafer.

14. The method of claim 1 further comprising a wafer test.

15. The method of claim 1 further comprising a final test.

16. The method of claim 1 wherein transferring or querying data provides the analysis results, and the displaying is performed by showing an in-line quality control (in-line QC) of each semiconductor product, a root case analysis (RCA) of each process, and a quality control and yield improvement of different kinds of processes being displayed.

17. The method of claim 1 wherein the analysis module is a T-test, a one-way analysis of variance (ANOVA), a two-way analysis of variance, or box plots.

18. The method of claim 1 wherein displaying the analysis result further comprises:
setting a customized displaying mode by a user for recording ways to display analysis results; and
displaying the analysis results to the user according to the customized displaying mode.

19. The method of claim 18 wherein displaying the analysis result further comprises:
providing a plurality of default displaying modes with each default displaying mode recording a predetermined way of displaying analysis results, such that the user sets the customized data displaying mode by selecting a default displaying mode to be the customized displaying mode.

* * * * *